United States Patent
Veerasamy et al.

(10) Patent No.: US 6,878,404 B2
(45) Date of Patent: *Apr. 12, 2005

(54) METHOD OF DEPOSITING DLC ON SUBSTRATE

(75) Inventors: Vijayen S. Veerasamy, Ann Arbor, MI (US); Scott V. Thomsen, Milford, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 104 days.

This patent is subject to a terminal disclaimer.

(21) Appl. No.: 10/359,298

(22) Filed: Feb. 6, 2003

(65) Prior Publication Data

US 2004/0157058 A1 Aug. 12, 2004

(51) Int. Cl.$^7$ .............................................. C23C 16/26
(52) U.S. Cl. .................. 427/249.7; 427/533; 427/255.7
(58) Field of Search .......................... 427/249.7, 255.7, 427/533

(56) References Cited

U.S. PATENT DOCUMENTS

| | | | |
|---|---|---|---|
| 5,104,684 A | * | 4/1992 | Tao et al. .................... 427/526 |
| 5,455,081 A | | 10/1995 | Okada et al. |
| 5,547,714 A | * | 8/1996 | Huck et al. ................. 427/523 |
| 5,618,619 A | * | 4/1997 | Petrmichl et al. ........... 428/334 |
| 5,635,258 A | | 6/1997 | Chen et al. |
| 5,637,353 A | | 6/1997 | Kimock et al. |
| 6,020,677 A | * | 2/2000 | Blanchet-Fincher et al. ............. 313/336 |
| 6,046,758 A | * | 4/2000 | Brown et al. ................ 347/203 |
| 6,077,569 A | | 6/2000 | Knapp et al. |
| 6,277,480 B1 | | 8/2001 | Veerasamy et al. |
| 6,280,834 B1 | | 8/2001 | Veerasamy et al. |
| 6,303,226 B2 | | 10/2001 | Veerasamy |
| 6,338,901 B1 | | 1/2002 | Veerasamy |
| 6,395,412 B1 | * | 5/2002 | Honda et al. ......... 428/694 TR |
| 6,416,816 B2 | * | 7/2002 | Veerasamy et al. ...... 427/249.7 |
| 6,504,294 B1 | * | 1/2003 | Mahoney et al. ........ 313/359.1 |
| 6,531,182 B2 | * | 3/2003 | Veerasamy et al. ...... 427/249.7 |
| 6,638,570 B2 | * | 10/2003 | Veerasamy ............... 427/249.7 |
| 6,660,340 B1 | * | 12/2003 | Kirkpatrick ................. 427/530 |
| 6,761,736 B1 | * | 7/2004 | Woo et al. .................. 623/2.42 |

OTHER PUBLICATIONS

"Highly Tetrahedral, Diamond–Like Amorphous Hydrogenated Carbon Prepared from a Plasma Beam Source", Weiler et al., May 1994, No. 21, pp. 2797–2799.

(Continued)

*Primary Examiner*—Bret Chen
(74) *Attorney, Agent, or Firm*—Nixon & Vanderhye P.C.

(57) ABSTRACT

Durability and/or longevity of a diamond-like carbon (DLC) layer can be improved by varying the voltage and/or ion energy used to ion beam deposit the DLC layer. For example, a relatively low voltage may be used to ion beam deposit a first portion of the DLC layer on the substrate, and thereafter a second higher voltage(s) used to ion beam deposit a second higher density portion of the DLC layer over the first portion of the DLC layer. In such a manner, ion mixing at the bottom of the DLC layer can be reached, and the longevity and/or durability of the DLC improved.

27 Claims, 4 Drawing Sheets

OTHER PUBLICATIONS

"Fluorinated Diamond–Like Carbon Films Produced by Plasma Immersion Ion Processing Technique", Hakovirta et al., Mat. Res. Soc. Symp. Proc. vol. 593, 2000, pp. 286–290.

"Formation of Hydrogenated Amorphous Carbon Films by Plasma Based Ion Implantation System Applying RF and Negative High Voltage Pulses Through Single Feedthrough", Mokuno et al., Surface and Coatings Technology 156 (2002) pp. 328–331.

"Deposition of Diamond–Like Carbon Films Using Plasma Based Ion Implantation with Bipolar Pulses", Miyagawa et al., Surface and Coatings Technology 156 (2002) pp. 322–327.

"Electronic Density of States in Highly Tetrahedral Amorphous Carbon", Veerasamy et al., Solid–State Electronics vol. 37, No. 2, pp. 319–326.

"Deposition of Carbon Films by a Filtered Cathodic Arc", Kuhn et al., Diamond and Related Materials, 2 (1993) Aug. 16, No. 10, pp. 1350–1354.

"Optical and Electronic Properties of Amorphous Diamond", Veerasamy et al., Diamond and Related Materials, 2 (1993) pp. 782–787.

* cited by examiner

METHOD OF DEPOSITING DLC ON SUBSTRATE

This invention relates to a method of depositing diamond-like carbon (DLC) on a substrate (e.g., glass substrate), and/or to the resulting product. In particular, this invention relates to a method of depositing DLC on a substrate in a manner such that a first portion of the DLC is ion beam deposited using a first voltage(s) and a second subsequent portion of the DLC is ion beam deposited using a second higher voltage(s) so that the second portion of the DLC has a higher density than the first portion of the DLC.

BACKGROUND OF THE INVENTION

Techniques for ion beam depositing DLC are known in the art. Typically, a layer of DLC which is ion beam deposited on a glass substrate is deposited using a constant voltage (or ion energy, which is related to but different than the anode-cathode voltage per se as will be explained below) thereby resulting in a layer of DLC having a constant density.

For example, consider a situation where a layer of DLC is ion beam deposited directly on a glass substrate using a voltage of about 3,000 V. The high voltage, between the anode and cathode of the ion source, causes ions to be accelerated toward the substrate to be coated with such high energy that significant ion mixing at the glass/DLC interface can occur. In particular, significant ion mixing between Si and C at the interface occurs thereby leading to many Si-C bonds. Unfortunately, such Si-C bonds in the DLC layer are believed to be more susceptible to breaking down upon exposure to ultraviolet (UV) radiation and water (i.e., QUV) than are C—C and C—H bonds. Thus, the presence of many Si-C bonds in a layer of DLC, especially a very thin layer of DLC such as from 20–100 Å thick, can lead to premature breakdown of the layer upon environmental exposure (i.e., reduced longevity).

Thus, it can be seen that DLC layers that are deposited using a constant voltage (especially a high voltage used to deposit a thin DLC layer) are problematic in that their lifetime is rather short due to the high amount of ion mixing at the glass/DLC interface. This high amount of ion mixing, and the large number of resulting Si-C bonds, renders the DLC layer more susceptible to breaking down upon environmental exposure.

In view of the above, it will be appreciated by those skilled in the art that there exists a need in the art for a technique for depositing a DLC inclusive layer(s) that is more durable and/or has improved longevity.

BRIEF SUMMARY OF THE INVENTION

Surprisingly, it has been found that durability and/or longevity of a diamond-like carbon (DLC) layer can be improved by varying the voltage (and/or ion energy) used to ion beam deposit the DLC layer. In particular, a low voltage (voltage between the anode and cathode of the ion source) is used to ion beam deposit a first portion of the DLC layer on the substrate, and thereafter the voltage is increased to a second higher voltage(s) which is used to ion beam deposit a second portion of the DLC layer over the first portion of the DLC layer. In such a manner, ion mixing at the bottom of the DLC layer can be reduced, and the longevity and/or durability of the DLC improved. Moreover, the use of the higher voltage(s) for the second portion of the DLC layer enables that portion of the layer to have a high density and thus better hardness/scratch resistance than the first portion of the DLC layer.

In certain embodiments of this invention, the DLC layer may be deposited directly on a glass substrate. In other embodiments of this invention, a coating such as a low-E coating may be provided between the substrate and the DLC layer.

In certain example embodiments of this invention, a method of forming a layer comprising diamond-like carbon (DLC) on a substrate is provided, the method comprising: using a first voltage to ion beam deposit a first portion of the layer comprising DLC on the substrate; and using a second voltage, higher than the first voltage, to ion beam deposit a second portion of the layer comprising DLC over at least the first portion of the layer comprising DLC.

In other example embodiments of this invention, a coated article including DLC supported by at least a glass substrate is provided, the coated article comprising: a layer comprising DLC including a first layer portion and a second layer portion, the first layer portion being located between the second layer portion and the substrate and having an average density less than that of the second layer portion. In certain example instances, the second layer portion may have a density greater than 2.4 gm/cm$^3$, and the first layer portion a density less than 2.4 gm/cm$^3$.

In certain other example embodiments of this invention there is provided a method of making a coated article, the method comprising: ion beam depositing a first portion of a layer comprising DLC using a first ion energy; and thereafter ion beam depositing a second portion of the layer comprising DLC using a second ion energy which is higher than the first ion energy.

DETAILED DESCRIPTION OF THE INVENTION

According to certain example embodiments of this invention, it has been found that durability and/or longevity of a diamond-like carbon (DLC) layer can be improved by varying the voltage and/or ion energy used to ion beam deposit the DLC layer. A low voltage (and/or low ion energy) is used to ion beam deposit a first portion of the DLC layer on the substrate, and thereafter a second higher voltage(s) (and/or second ion energy(ies)) is used to ion beam deposit a second portion of the DLC layer over the first portion of the DLC layer. In such a manner, ion mixing at the bottom of the DLC layer can be reduced, and the longevity and/or durability of the DLC improved. Moreover, the use of the higher voltage(s) for the second portion of the DLC layer enables that portion of the layer to have a high density and thus better hardness/scratch resistance than the first portion of the DLC layer.

This allows a thicker coating with an overall lower k value to be deposited. In particular, since the lower voltage and lower density DLC layer portion has a lower k value (e.g., about one third in certain example embodiments), this allows a thicker DLC layer to be deposited without sacrificing absorption losses. Experimental data has shown that DLC layers with a thickness above about 45 Å have improved longevity in QUV (a combination of UV and water exposure which simulates environmental exposure).

In certain embodiments of this invention, the DLC layer may be deposited directly on a glass substrate. In other embodiments of this invention, a layer or coating (e.g., low-E coating, or a dielectric layer(s)) may be provided between the substrate and the DLC layer.

Figure 1:
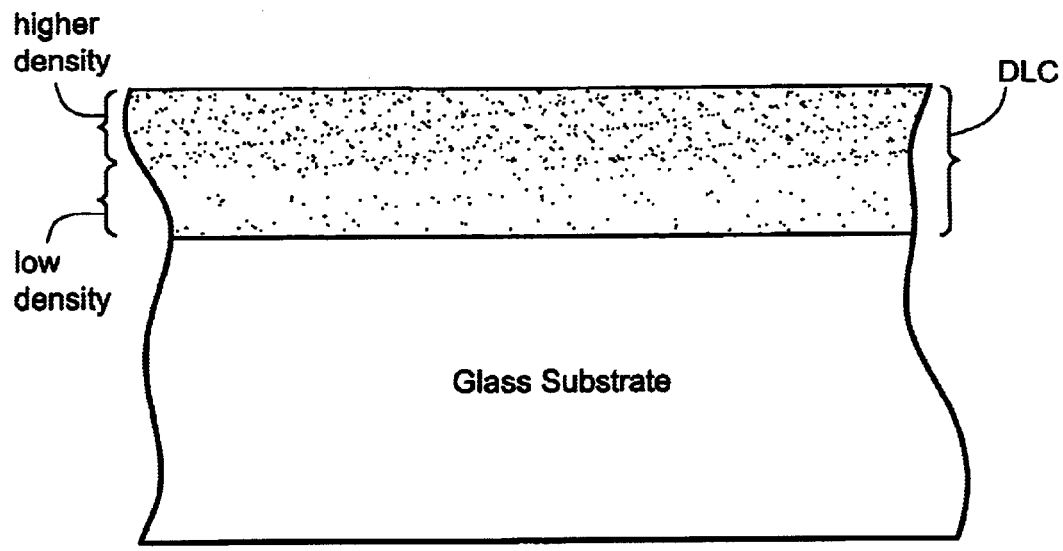
FIG. 1 is a cross sectional view of a coated article according to an example embodiment of this invention.

FIG. 1 is a cross sectional view of a coated article according to an example embodiment of this invention where a DLC layer is directly deposited on a glass (soda lime silica glass) substrate. It can be seen that the first portion of the DLC layer, deposited with a low voltage relative to the second portion of the layer, has a low density (e.g., less than 2.4 gms/cm$^3$, more preferably from 2.0 to 2.35 gm/cm$^3$). Meanwhile, the upper or second portion of the DLC layer, deposited with the higher voltage(s) (or ion energy(ies), has a higher average density (e.g., greater than or equal to 2.4 gms/cm$^3$, more preferably from 2.5 to 3.0 gm/cm$^3$). The higher the anode-cathode voltage used in ion beam depositing the DLC, the higher the resulting density. Moreover, the second portion of the DLC layer with the higher density has an average hardness of at least 10 GPa, more preferably of at least 20 GPa, and most preferably of at least 40 GPa. It will be appreciated that the first layer portion with the low density is less diamond-like than the second portion with the higher density and higher hardness.

The low density DLC layer portion and the higher density DLC layer portion may be directly adjacent one another in certain embodiments of this invention. Alternatively, in other embodiments of this invention, these two layer portions may be separated by another DLC layer portion such as an intermediate density layer portion.

The relatively low voltage (and/or ion energy) used to deposit the low density DLC layer portion reduces ion mixing at the DLC/glass interface. Thus, this low ion energy or voltage reduces the number of Si-C bonds formed in the DLC. As a result, the low density DLC layer portion adjacent the substrate acts as a barrier for reducing such ion mixing. After this low density barrier portion of the DLC has been ion beam deposited, a higher voltage (and/or ion energy) is used to deposit the higher density portion(s) of the DLC layer. The high voltage(s) enable a denser DLC layer portion which is harder and more durable than the low density DLC layer portion.

The high density DLC layer portion has more sp$^3$ carbon—carbon bonds than does the low density DLC layer portion. In certain example embodiments, the high density DLC layer portion may have at least 10% more sp$^3$ carbon—carbon bonds than the low density DLC layer portion, even more preferably at least 20% more Sp$^3$ carbon—carbon bonds. In certain embodiments of this invention, at least about 40% of the carbon—carbon bonds in the high density DLC layer portion are of the sp$^3$ type (as opposed to the sp$^2$ type), more preferably at least about 50% of the carbon—carbon bonds in the high density DLC layer portion are of the sp$^3$ type, and sometimes as many as 60% or more of the carbon—carbon bonds in the high density DLC layer portion are of the sp$^3$ type.

The DLC layer may be hydrogenated in certain embodiments of this invention. In such embodiments, the DLC layer may include from about 2–25% hydrogen, more preferably from about 5–20% hydrogen. The hydrogen may be introduced by ion beam depositing the DLC using a hydrocarbon gas such as acetylene. Other dopant(s) may also be provided in the DLC layer.

The DLC layer shown in FIG. 1 may be of any suitable thickness in various embodiments of this invention. However, in certain preferred embodiments, the DLC layer may be from about 30–100 Å thick, more preferably from about 40–100 Å thick. It has been found that the use of varying ion energies as discussed herein is especially beneficial to DLC layers of such low thicknesses in terms of longevity and durability.

It has also surprisingly been found that the thickness of the low density portion of the DLC layer should be at least about 25 Å in certain example embodiments of this invention, more preferably at least about 30 Å. If the low density portion of the DLC layer is not at least this thick, when the upper higher density DLC layer portion(s) is/are grown, energetic C ions may subimplant through the low density DLC layer and cause ion mixing at the glass/DLC interface by churning up more Si thereby leading to the formation of additional undesirable Si-C bonds.

In certain example embodiments of this invention, no greater than 2,500 V (more preferably no greater than 1,200 V, and most preferably no greater than 1,100 V) is used to form the low density DLC layer portion which is the bottom-most portion of the DLC layer. In certain example embodiments, at least about 1,500 V is used to form the uppermost high density portion of the DLC layer (more preferably at least about 2,500 V, and most preferably at least about 2,800 V). Thus, in certain example embodiments of this invention, the voltage (and/or the ion energy in certain embodiments) used to form the uppermost high density portion of the DLC layer is at least about 10% higher than that used to form the lowermost low density portion of the DLC layer (more preferably at least about 25% higher, and even more preferably at least about 50% higher).

The aforesaid "voltage" (or accelerating voltage) referred to which is used to form the DLC layer portions is the voltage between the anode and the cathode of the ion source. As mentioned above, ion energy is related to voltage but is different therefrom. The molecular fragment ion energy is one half (½) of the accelerating voltage for molecular acetylene or any other substance. Thus, the molecular fragment ion energy, given a voltage of 3,000 V would be 3,000/2=1,500 V. Moreover, in the case of C ions formed from acetylene ($C_2H_2$) used as a feedstock gas in the ion source, there are two carbon atoms per molecular fragment (each molecular fragment has two carbon atoms). Thus, the energy per carbon ion is the molecular fragment ion energy divided by 2 in this case. In other words, given a voltage of 2,500 V, the energy per carbon ion is 3,000/4=750 eV (750 eV per C ion).

Figure 2:
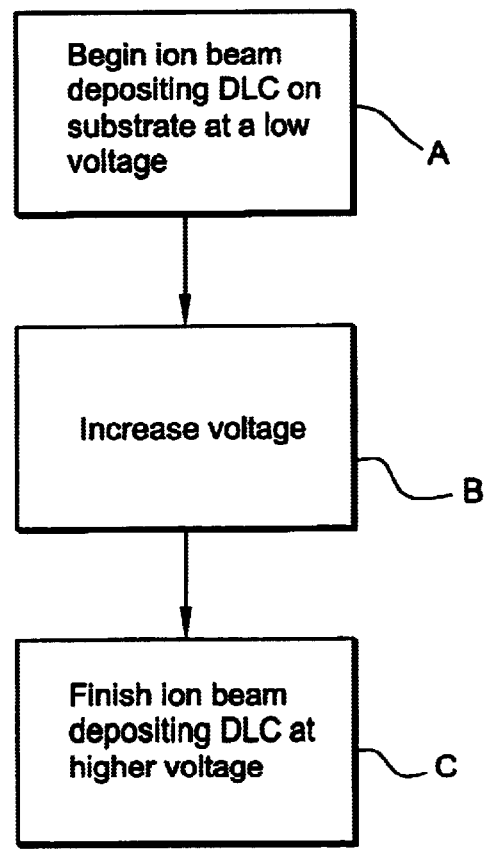
FIG. 2 is a flowchart illustrating certain steps taken according to an example embodiment of this invention.

FIG. 2 is a flowchart illustrating certain steps taken in accordance with an example embodiment of this invention. In step A, the bottom-most portion of the DLC layer is ion beam deposited so as to have a relatively low density using a low ion energy or voltage. After the low density portion of the DLC layer has been ion beam deposited, the voltage is increased in step B, either using the same ion source, or a different ion source(s). After the voltage increase, a higher density portion of the DLC layer is ion beam deposited at the higher voltage in step C.

Figure 3:
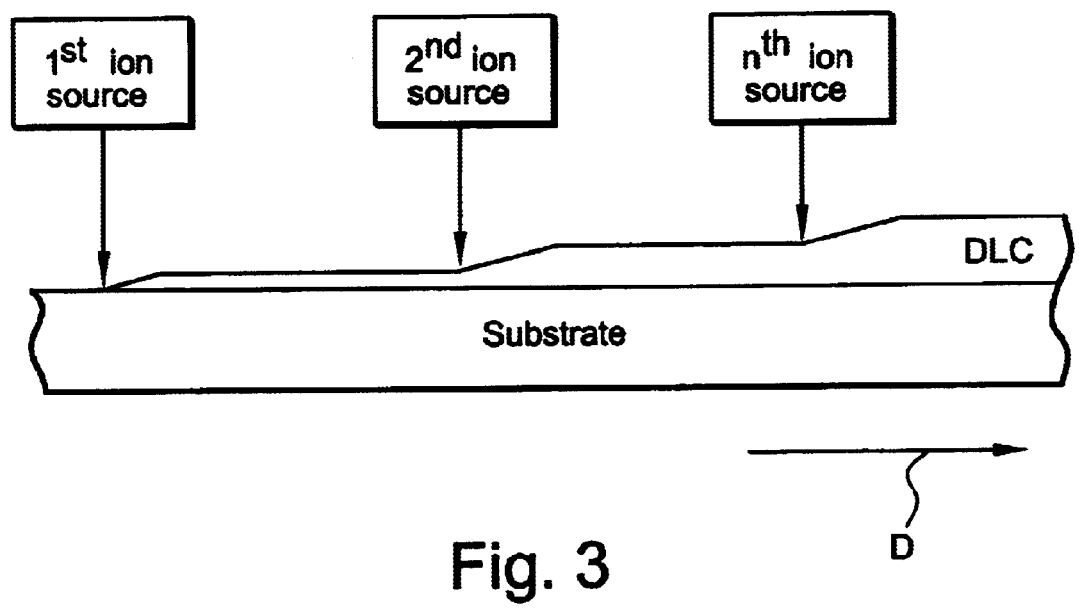
FIG. 3 is a schematic diagram illustrating an apparatus for ion beam depositing a DLC layer according to an example embodiment of this invention.

FIG. 3 illustrates an example apparatus used for depositing the varying density DLC layer in accordance with an example embodiment of this invention. The apparatus includes n ion sources. The number of n ion sources may be anywhere from 1 to 10 in different embodiments of this invention, although a greater number may in theory be used. The ion beams may be diffused, collimated, and/or focused in different embodiments of this invention.

For purposes of example only, still referring to FIG. 3, assume that in an example embodiment of this invention four ion sources are used to deposit the DLC layer (i.e., n=4). The first ion source may deposit the low density lowermost portion of the DLC layer using a voltage of about 1,000 V (1,000/4 eV per C ion when acetylene used as feedstock gas). The second ion source may deposit an intermediate density portion of the DLC layer (which has a higher density than the low density portion, but a lower density than the highest density portion of the DLC layer) directly over the low density portion of the DLC layer using a voltage of about 1,500 V. Then, the third and fourth ion sources may deposit the uppermost high density portion of the DLC layer over the low and intermediate density portions using a voltage of about 3,000 V. Of course, the respective ion energies used are staggered in a corresponding manner. The result is a DLC layer that is graded with respect to density; the DLC layer has a relatively low density close to the substrate, and a higher density at a location further from the substrate. The number of undesirable Si-C bonds in the DLC layer is reduced due to the low voltage and ion energy used to deposit the low density portion of the layer. However, the DLC layer is still very durable and scratch resistant due to the high voltage(s) and ion energy(ies) used to deposit the higher density portions of the DLC layer.

The aforesaid example where n=4 (four ion sources) was in a situation where the ion sources were stationary and the substrate to be coated moved under the sources in direction D. However, in other embodiments of this invention, an ion source(s) may move across the substrate while the substrate remains stationary in order to deposit all or part of the DLC layer.

Figure 4:
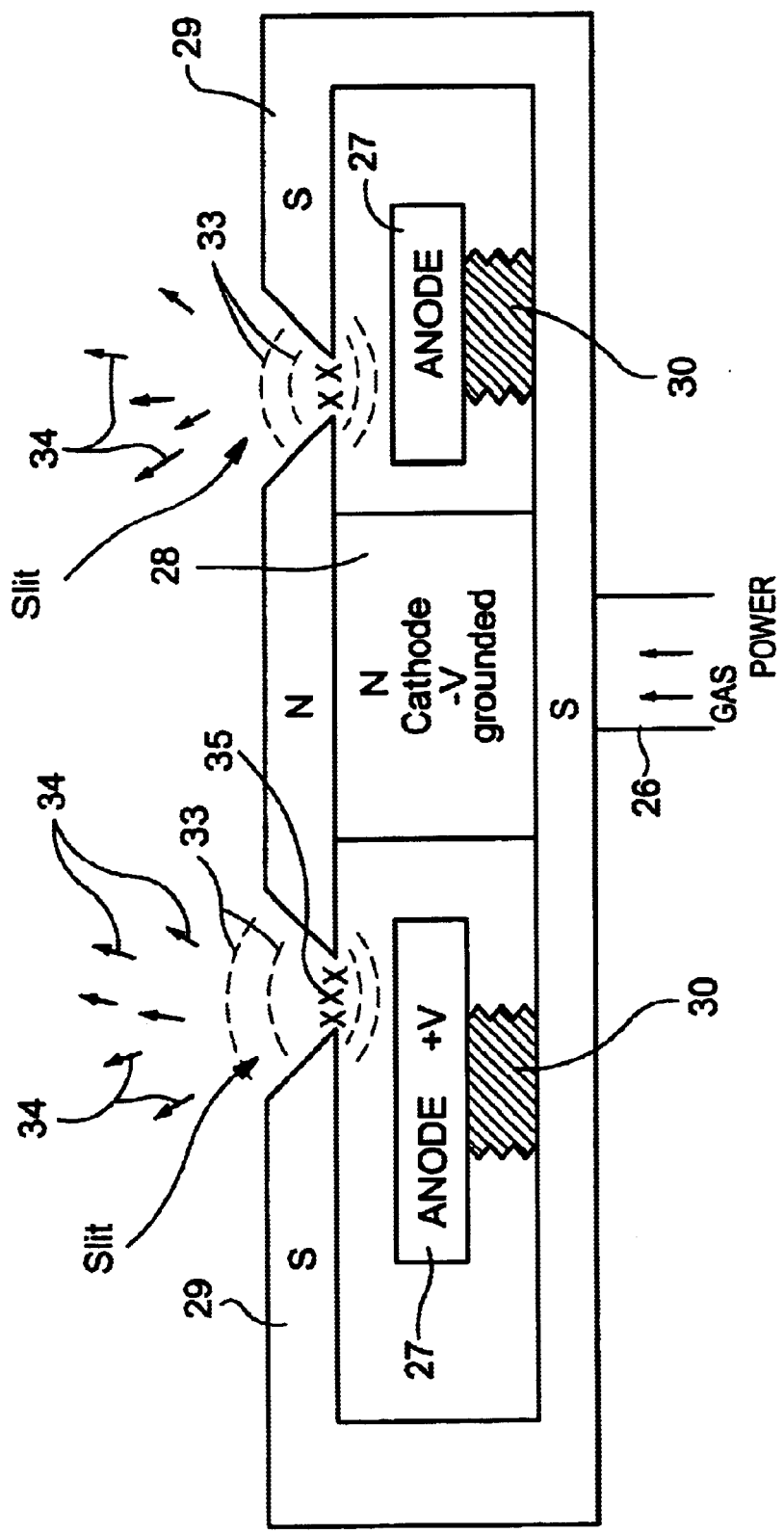
FIG. 4 is a cross sectional view of an example ion source that may be used to deposit DLC according to an example embodiment of this invention.
Figure 5:
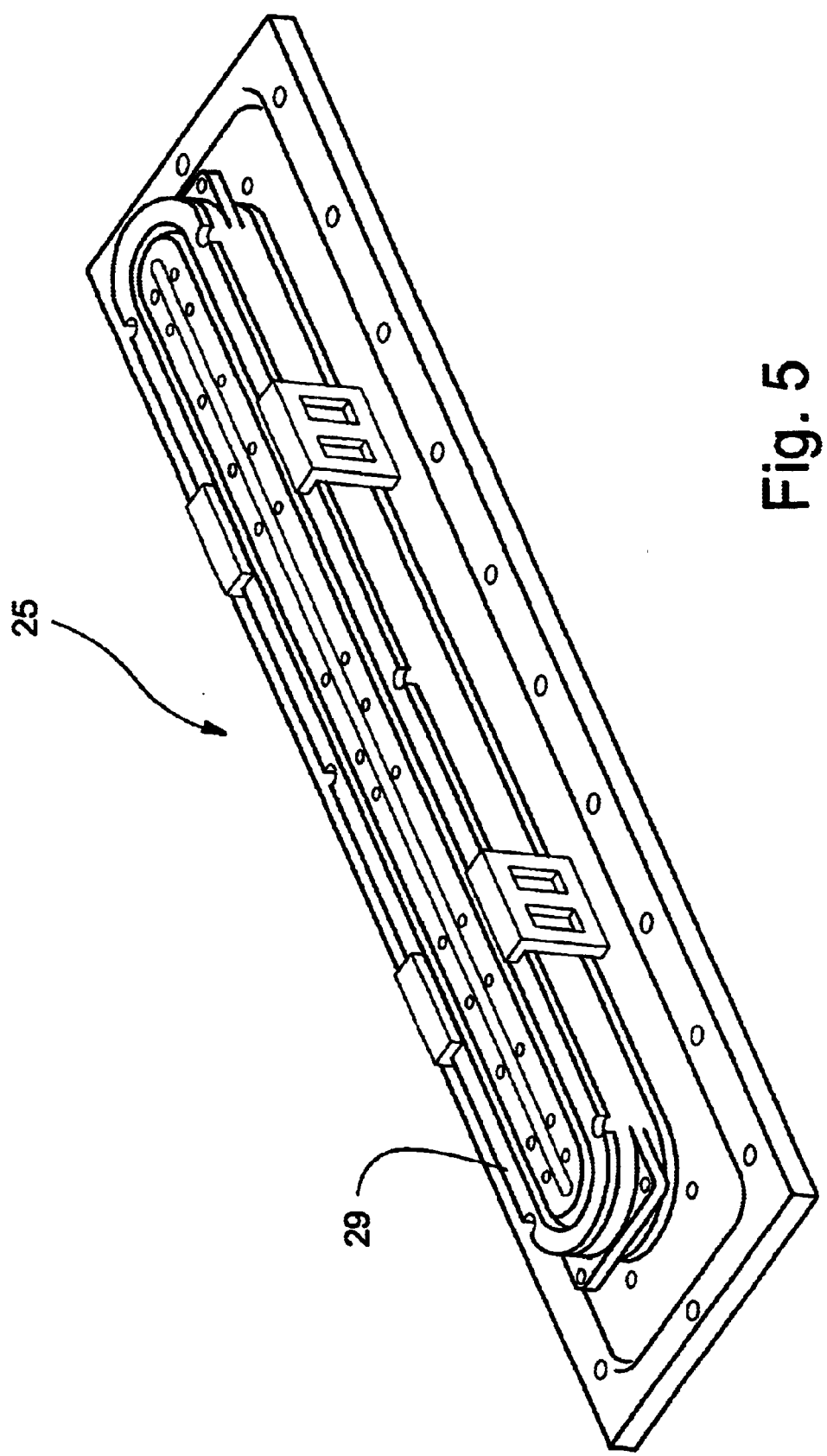
FIG. 5 is a perspective view of the ion source of FIG. 4.

FIGS. 4–5 illustrate an example linear ion beam source 25 which may be used to deposit DLC. Ion beam source 25 includes gas/power inlet 26, anode 27, grounded cathode magnet portion 28, cathode magnet portion 29, and insulators 30. A 3 kV (or other power supply amount) DC and/or AC power supply may be used for source 25 in some embodiments. The voltages described above are provided between the anode 27 and the cathode 29 of the ion source proximate the electric gap near the racetrack shaped slit in the cathode.

Still referring to FIGS. 4–5, the ion beam B from the source may be focused or non-focused (e.g., diffused) in different embodiments of this invention. Ion beam source 25 is based upon a known gridless ion source design. The linear source includes a linear shell (which is the cathode and grounded) inside of which lies a concentric anode (which is at a positive potential). This geometry of cathode-anode and magnetic field 33 gives rise to a closed drift condition. The anode layer ion source can also work in a reactive mode. The source includes a metal housing with a slit in a shape of a race track as shown in FIGS. 4–5. The hollow housing is at ground potential. The anode electrode 27 is situated within the cathode body 28, 29 (though electrically insulated) and is positioned just below the slit. The anode 27 can be connected to a positive potential as high as 3,000 or more volts (V) (or as otherwise needed for the varying ion energies used herein). Both electrodes may be water cooled in certain embodiments. One or more feedstock or precursor gas (e.g., acetylene, other hydrocarbon gas, or any other suitable gas) is/are fed through the cavity between the anode and cathode (or alternatively may be otherwise provided at the source). The linear ion source also contains a labyrinth system that distributes the precursor gas(es) fairly evenly along its length and which allows it to expand between the anode-cathode space internally. The electrical energy then cracks the gas(es) to produce a plasma within the source. The ions are expelled out at energies in the order of $eVc-a/2$ when the voltage is Vc-a. The ion beam emanating from the slit is approximately uniform in the longitudinal direction and has a Gaussian profile in the transverse direction. Exemplary ions 34 in ion beam B are shown in FIG. 4. A source as long as 1–4 meters may be made, although sources of different lengths are anticipated in different embodiments of this invention. Electron layer 35 completes the circuit thereby enabling the ion beam source to function properly. Still referring to FIGS. 4–5, a feedstock gas(es) may be fed through the ion beam source via cavity 42 until it/they reach the area near slit 44 where it/they is/are ionized.

The ion beam source of FIGS. 4–5 is merely exemplary. Thus, in alternative embodiments of this invention, an ion beam source device or apparatus as described and shown in FIGS. 1–3 of U.S. Pat. No. 6,002,208 (hereby incorporated herein by reference in its entirety) may be used. Any other suitable type of ion source may also be used.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of forming a layer comprising diamond-like carbon (DLC) on a substrate, the method comprising:
    using a first anode-cathode voltage to ion beam deposit a first portion of the layer comprising DLC on the substrate; and
    using a second anode-cathode voltage, higher than the first voltage, to ion beam deposit a second portion of the layer comprising DLC over at least the first portion of the layer comprising DLC.

2. The method of claim 1, wherein the second portion of the layer comprising DLC has a higher density than the first portion of the layer comprising DLC.

3. The method of claim 1, wherein the second voltage is at least 10% greater than the first voltage, and where the first portion of the layer comprising DLC is the lowermost portion of the layer comprising DLC.

4. The method of claim 1, wherein the second voltage is at least 25% greater than the first voltage, and wherein the first voltage is used in a first ion source and the second voltage is used in a second ion source.

5. The method of claim 1, wherein the second voltage is at least 50% greater than the first voltage.

6. The method of claim 1, wherein an intermediate portion of the layer comprising DLC is provided between the first and second portions of the layer comprising DLC, wherein the intermediate portion has a density higher than the first portion but lower than the second portion.

7. The method of claim 1, wherein a low-E coating is provided between the substrate and the layer comprising DLC.

8. The method of claim 1, wherein the substrate comprises soda lime silica glass.

9. The method of claim 1, wherein the first voltage is no greater than 1,200 V.

10. The method of claim 1, wherein the second voltage is at least 1,500 V.

11. The method of claim 1, wherein the second voltage is at least 2,500 V.

12. The method of claim 1, wherein the second portion of the layer comprising DLC has a density greater than 2.4 gm/cm$^3$, and the first portion of the layer comprising DLC has a density less than 2.4 gm/cm$^3$.

13. The method of claim 1, wherein the first and second portions of the layer comprising DLC are in direct contact with one another.

14. The method of claim 1, wherein a first ion source uses the first voltage, and a different second ion source uses the second voltage.

15. The method of claim 1, wherein the same ion source uses the first and second voltages in forming at least part of the layer comprising the DLC.

16. The method of claim 1, wherein the first portion of the layer comprising DLC is at least about 25 thick.

17. The method of claim 1, wherein the second portion of the layer comprising DLC includes at least 10% more sp$^3$ carbon—carbon bonds than does the first portion of the layer comprising DLC.

18. The method of claim 1, wherein the second portion of the layer comprising DLC includes at least 20% more Sp$^3$ carbon—carbon bonds than does the first portion of the layer comprising DLC.

19. The method of claim 1, wherein the layer comprising DLC is from about 30–100 thick.

20. The method of claim 1, wherein the layer comprising DLC includes from about 5 to 20% hydrogen.

21. A method of making a coated article, the method comprising:

ion beam depositing a first portion of a layer comprising diamond-like carbon (DLC) using a first ion energy; and thereafter ion beam depositing a second portion of the layer comprising DLC using a second ion energy which is higher than the first ion energy.

22. The method of claim 21, wherein the second ion energy is at least 10% higher than the first ion energy.

23. The method of claim 21, wherein the first ion energy is used in a first ion source, and the second ion energy is used in at least a second ion source.

24. The method of claim 21, wherein the second portion of the layer comprising DLC has an average density greater than 2.4 gm/cm$^3$, and the first portion of the layer comprising DLC has an average density less than 2.4 gm/cm$^3$.

25. The method of claim 21, wherein the first ion energy is no greater than 300 eV per C ion, and the second ion energy is at least 375 eV per C ion.

26. The method of claim 21, wherein the second ion energy is at least 10% greater than the first ion energy, and where the first portion of the layer comprising DLC is the lowermost portion of the layer comprising DLC.

27. The method of claim 21, wherein the first and second ion energies are used in the same ion source.

* * * * *